(12) United States Patent　　　　(10) Patent No.: US 12,700,879 B2

Krüger et al.　　　　　　　　　　　(45) Date of Patent: Aug. 4, 2026

(54) MOBILE WIRELESS RECEIVER

(71) Applicant: Sennheiser electronic SE & Co. KG, Wedemark (DE)

(72) Inventors: Christian Krüger, Wedemark (DE); Marvin Schwarz, Langenhagen (DE)

(73) Assignee: Sennheiser electronic SE & Co. KG, Wedemark (DE)

( * ) Notice: Subject to any disclaimer, the term of this patent is extended or adjusted under 35 U.S.C. 154(b) by 234 days.

(21) Appl. No.: 18/630,637

(22) Filed: Apr. 9, 2024

(65) Prior Publication Data

US 2024/0348269 A1　　Oct. 17, 2024

(30) Foreign Application Priority Data

Apr. 13, 2023　(DE) ........................ 102023109331.2

(51) Int. Cl.
　*H04B 1/00*　　(2006.01)
　*H03H 7/42*　　(2006.01)
　*H04B 1/16*　　(2006.01)
(52) U.S. Cl.
　CPC ............. *H04B 1/0071* (2013.01); *H03H 7/42* (2013.01); *H04B 1/1607* (2013.01)
(58) Field of Classification Search
　CPC ....... H04B 1/0071; H04B 1/1607; H03H 7/42
　See application file for complete search history.

(56) References Cited

U.S. PATENT DOCUMENTS

| | | | | |
|---|---|---|---|---|
| 3,867,699 | A * | 2/1975 | Stoffer | H04B 1/44 |
| | | | | 455/86 |
| 5,179,732 | A * | 1/1993 | Omoto | H03D 9/0608 |
| | | | | 455/330 |
| 6,278,872 | B1 * | 8/2001 | Poulin | H03D 7/14 |
| | | | | 455/333 |
| 6,839,551 | B1 * | 1/2005 | Wong | H03D 7/161 |
| | | | | 375/324 |
| 8,050,644 | B1 * | 11/2011 | Cosand | H03D 7/1466 |
| | | | | 455/295 |
| 2003/0151136 | A1 | 8/2003 | Ji | |
| 2010/0158084 | A1 | 6/2010 | Voinigescu et al. | |

OTHER PUBLICATIONS

Search Report dated Jan. 16, 2024 issued in the corresponding German application No. 10 2023 109 331.2.

* cited by examiner

*Primary Examiner* — Junpeng Chen

(74) *Attorney, Agent, or Firm* — Jon E. Gordon; Haug Partners LLP

(57)　　　　ABSTRACT

A mobile wireless receiver is provided comprising an HF input, an intermediate-frequency output, a first and second mixer, which are each operated in common mode with a frequency of a local oscillator, a first balun circuit, which is coupled to the HF input and a second balun circuit, which is coupled to the intermediate-frequency output, a first common mode trap, which is coupled to the first balun circuit and the first and second mixer and a second common mode trap, which is coupled to the second balun circuit and the first and second mixer.

2 Claims, 2 Drawing Sheets

MOBILE WIRELESS RECEIVER

CROSS REFERENCE TO RELATED APPLICATIONS

This application claims priority under 35 U.S.C. § 119 to German Patent Application No. 102023109331.2, filed Apr. 13, 2023, the entirety of which is herein incorporated by reference.

FIELD OF DISCLOSURE

The present invention relates to a mobile wireless receiver for audio signals.

BACKGROUND

U.S. Pat. No. 7,848,713 B2 discloses a mobile wireless receiver. The wireless receiver comprises an antenna, a duplexer and an impedance matching network. A common mode trap is provided in the impedance matching circuit, which is arranged directly behind the duplexer. The duplexer outputs a differential signal. Furthermore, the duplexer can output a transmit signal to the antenna. The common mode trap prevents transmit signals which are not completely separated from the receive signal in the duplexer from interfering with the reception. The common mode trap comprises a Y-shaped circuit of two coils and a capacitor which form a common mode high pass which can short circuit high-frequency common mode signals. The signal is then amplified by an amplifier.

SUMMARY OF THE INVENTION

It is the object of the present invention to provide a mobile wireless receiver which is more robust and cost-effective.

This object is achieved by a mobile wireless receiver according to claim 1.

Thus, a mobile wireless receiver is provided comprising a high-frequency HF input, an intermediate-frequency output, a first and second mixer which are operated in common mode, a first and second common mode trap and a first and second balun circuit. The first balun circuit is coupled to the HF input and the second balun circuit is coupled to the intermediate-frequency output at which an intermediate-frequency signal is output. A balun circuit forms a passive circuit which is configured to convert between symmetrical (differential/balanced) and asymmetrical (unbalanced) signals.

An antenna can be connected to the high-frequency HF input. The first balun circuit is coupled to the HF input and generates a first differential signal from the signal received at the HF input, whose two poles are each fed to one of the two mixers as input signal. An oscillator signal is provided by a local oscillator LO and connected to an input LO. From the input LO the oscillator signal is fed to both mixers in each case as second input signal so that the two mixers are operated in common mode with the frequency of the local oscillator. The output signals of the two mixers form the two poles of a second differential signal which is fed to the second balun circuit. The second balun circuit generates the intermediate-frequency signal from the second differential signal, which intermediate-frequency signal is output at the output IF.

The first common mode trap is located between the two poles of the first differential signal and the second common mode trap is located between the two poles of the second differential signal. According to the invention, the common mode traps serve to suppress undesired common mode components in the differential signals in specific frequency ranges and to keep these frequency components in particular away from the antenna. Such undesired common mode components are formed as a result of the fact that the behaviour of real components—in particular the mixer but also the balun circuits—differ from the theoretical ideal behaviour. For example, cross talk can occur in the mixers, wherein undesired signal components of the oscillator signal with the LO frequency are coupled into the first differential signal. Furthermore, due to nonlinear behaviour the mixers can, for example, produce quadratic intermodulations (second-order intermodulation) and further undesired mixing products. Since the mobile wireless receiver should obtain its energy from a battery, a low power consumption is desirable. However, a low power consumption in the mixers is accompanied by a stronger nonlinear behaviour so that such interference can occur to a greater extent in this case of application.

The first and second common mode trap each comprise a Y circuit comprising two coils and a capacitor or a Y circuit comprising two capacitors and one coil.

In the case of two coils, the two coils have the same value of the inductance. In each case one end of both coils is connected to one pole of a differential signal. The respectively other ends of the two coils are connected to the midpoint of the Y circuit. One end of the capacitor is connected to the midpoint of the Y circuit and the other end is connected to a reference potential (earth).

In the case of two capacitors, the two capacitors have the same value of the capacitance. In each case, one end of the two capacitors is connected to a pole of a differential signal. The respectively other ends of the two capacitors are connected to the midpoint of the Y circuit. One end of the coil is connected to the midpoint of the Y circuit and the other end is connected to a reference potential (earth).

A common mode trap can be tuned to a frequency at which an applied common mode signal is discharged to the reference potential. The particular feature consists in that the common-mode traps are connected between the two poles of a differential signal. With regard to the desired differential signal that has a reversed sign in each case (push-pull mode) with respect to the reference potential at its two poles, the common mode trap has no effect. In relation to interference which occurs at both poles in common mode, however, the common mode trap forms a series resonant circuit whose resonance frequency can be specified by selection of the components. Common mode interference in the region of the resonance frequency is discharged to the reference potential and thereby significantly reduced.

According to one aspect of the present invention, the first common mode trap with its resonance frequency is set to the LO frequency of the local oscillator and the second common mode trap with its resonance frequency is set to the IF intermediate frequency of the intermediate-frequency signal.

Since the receiving circuit can now be implemented without a duplexer, the circuit can have a simpler structure. Due to the configuration of the receiver with the first common mode trap on the first balun circuit and the second common mode trap on the second balun circuit, the implementation of the circuit can be simplified considerably. The first common mode circuit can short circuit common mode signals in the region of the LO frequency. Here however the differential receive signal with the same frequency is not short-circuited. The signal components with the LO frequency which are undesirably coupled into the first differential signal due to cross talk at the two mixers occur in common mode at the poles of the first differential signal so that they can be suppressed by the first common mode trap.

The second common mode trap is set to the IF intermediate frequency of the intermediate-frequency signal and thus short circuits common mode signals in the region of the IF intermediate frequency. Here however, the differential signal with the same frequency is not short-circuited. Due to nonlinear behaviour of the mixers, undesired signal components can be produced in the second differential signal. In particular, due to quadratic intermodulations (second-order intermodulation), undesired common mode components are produced in the second differential signal which are suppressed by the second common mode trap.

With regard to the differential signals, a common mode trap in the design with two coils and a capacitor can optionally be interpreted as high pass and the design with two capacitors and one coil can optionally be interpreted as low pass. Optionally the first common mode trap for differential signals can be interpreted as high pass. Optionally the second common mode trap for differential signals can be interpreted as low pass.

The first and second common mode traps result in an improvement in the performance of the mixer architecture since underside frequencies can be suppressed or short-circuited. In particular, the emission of undesired frequencies via the antenna is suppressed. This is particularly important when an equidistant frequency channel usage (equidistant grid) is used, i.e. different wireless channels are each distributed over frequency at the same distance from each other since due to interactions of various transmission frequencies amongst one another, interference occurs particularly at the frequencies at which one further channel is provided in each case in an equidist. In addition, a low power consumption and low costs can be achieved. The lower power consumption can be achieved whereby the mixers can be used at an operating point which manages with a lower power consumption at the expense of a higher nonlinearity. The lower costs can be achieved by using only single mixers.

The second common mode trap comprises a Y circuit with a coil and two capacitors. The first common mode trap comprises a Y circuit with two coils and a capacitor. The configuration of the common mode traps can also be reversed. In other words, one of the common mode traps comprises a Y circuit with two coils and one capacitor and the other common mode trap comprises one Y circuit with two capacitors and one coil.

According to one aspect of the present invention, the first and second common mode traps comprise a Y circuit with two capacitors and a coil. This is advantageous since the component tolerances of the capacitors are better than those of the coils. Furthermore, the insertion loss is improved and the blocking depth of the damping is improved. Furthermore, the resistive component of the coil is advantageous.

Further configurations of the invention are the subject matter of the dependent claims.

BRIEF DESCRIPTION OF THE DRAWINGS

Advantages and exemplary embodiment of the invention will be explained in detail hereinafter with reference to the drawings.

DETAILED DESCRIPTION

Figure 1:
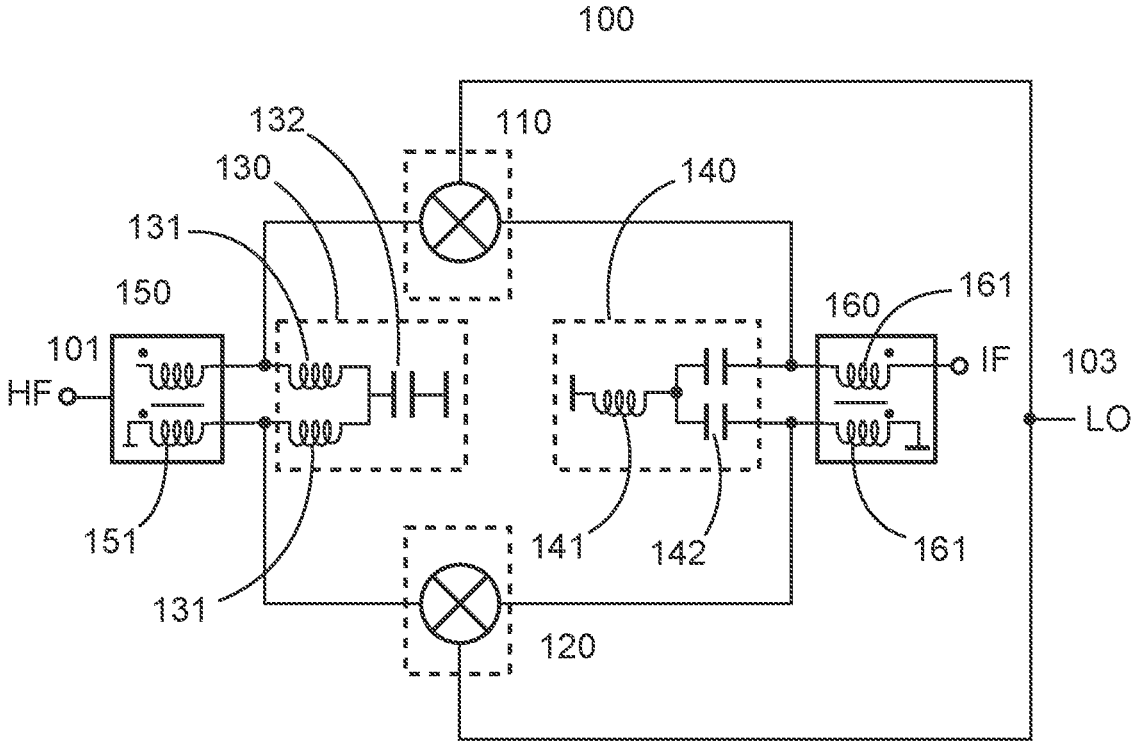
FIG. 1 shows a schematic diagram of a part of a mobile wireless receiver.

FIG. 1 shows schematic diagram of a part of a mobile wireless receiver. The mobile wireless receiver 100 comprises a first and a second mixer 110, 120, a first and a second common mode trap 130, 140, a first and second balun circuit 150, 160, a high-frequency input HF 101 and an intermediate-frequency IF output 102.

The high-frequency input 101 can receive an input signal from an antenna. The mixers 110 and 120 can be designed as asymmetric mixers ("single-ended mixer").

The first and second mixers 110, 120 are operated in common mode with the frequency of the local oscillator LO 103.

The first and second common mode trap 130, 140 can each be constructed as a Y circuit with two coils and a capacitor or from a Y circuit with two capacitors and one coil. Thus, for example, the first common mode trap 130 can have two coils 131 and one capacitor 132. The second common mode trap 140 can have one coil 141 and two capacitors 142.

The Y circuit of the first and second common mode trap 130, 140 can be configured as shown in FIG. 1. Alternatively, the first common mode trap 130 can have two capacitors and one coil and the second common mode trap can have two coils and one capacitor. Alternatively, the first and second common mode traps can have two coils and one capacitor or two capacitors and one coil. With regard to the differential signals, therefore both the first common mode trap 130 and also the second common mode trap 140 can optionally be designed as high pass or low pass as desired. Optionally the first common mode trap for differential signals can be designed as high pass. Optionally the second common mode trap for differential signals can be designed as low pass.

The first and second balun circuit 150, 160 forms a passive circuit in each case which can convert between symmetrical and asymmetric signals.

The first common mode trap 130 is tuned to the frequency of the local oscillator LO whereas the second common mode trap 140 is tuned to the intermediate frequency IF.

The first and second balun circuit 150, 160 each have two coils 151 or 161.

Figure 2:
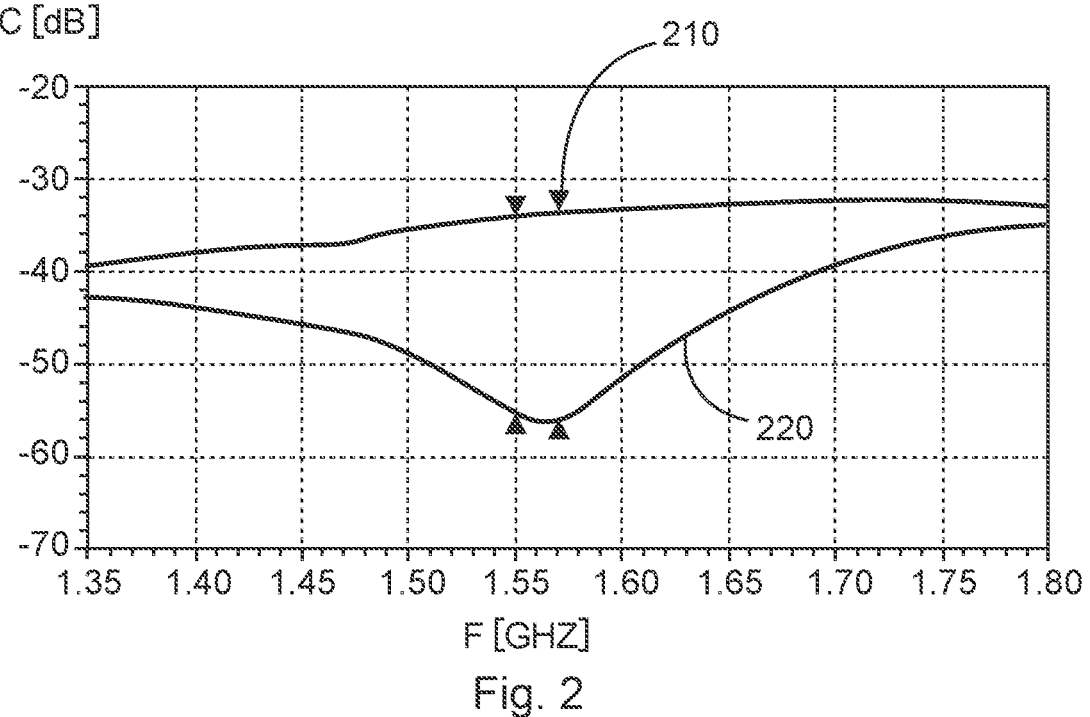
FIG. 2 shows a graph to illustrate the effect of a common mode trap at a first frequency and FIG. 3 shows a graph to illustrate the effect of a common mode trap at a second frequency.
Figure 3:
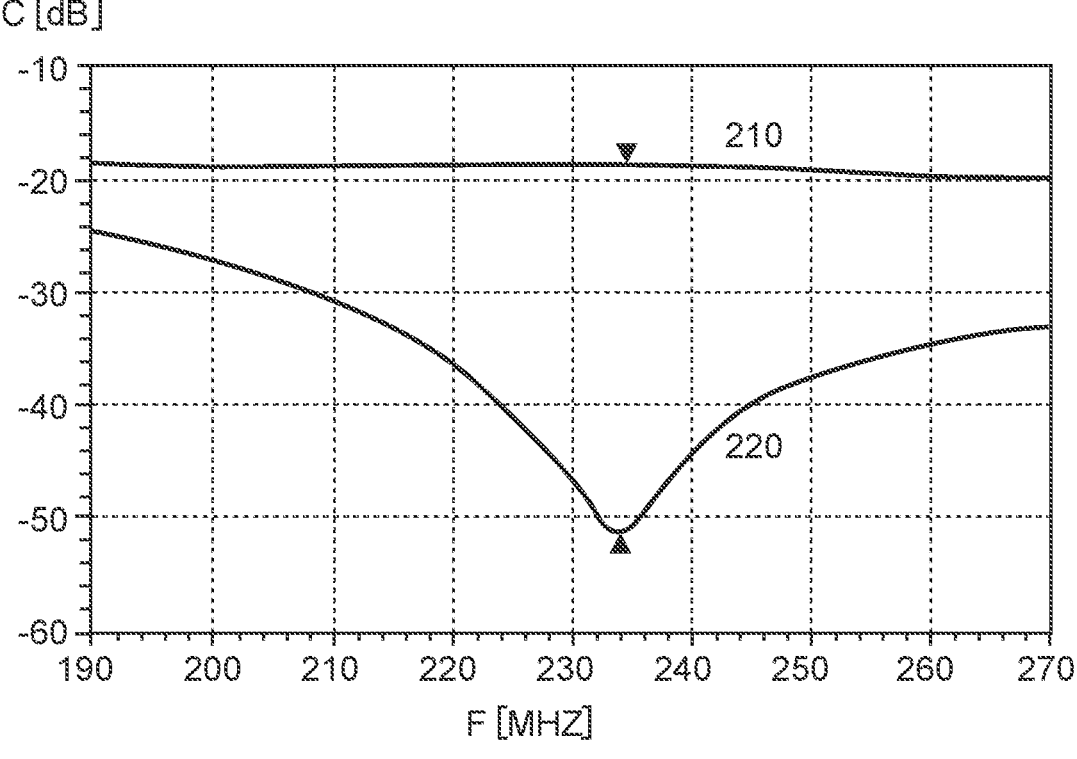

In each case, the effect of the common mode traps is shown graphically in FIGS. 2 and 3.

In FIG. 2 the effect of the first common mode trap 130 is shown for one example. The first common mode trap is tuned here with its resonance frequency to an LO frequency of the local oscillator of 1.56 GHZ. The graph 210 shows the transmission behaviour of (undesired) common mode components in the first differential signal to the HF input via the frequency F without the first common mode trap 130. The graph 210 shows the corresponding transmission behaviour with the first common mode trap 130.

Thus, in this example an improvement by more than 20 dB can be achieved at the LO frequency.

FIG. 3 shows the effect of the second common mode trap 140 for an example. The second common mode trap is here tuned with its resonance frequency to an IF frequency of the intermediate frequency signal of 234.5 MHZ. The graph 210 here shows the transmission behaviour of (undesired) common mode components in the second differential signal to the IF output via the frequency F without the second common mode trap 140. The graph 220 shows the corresponding transmission behaviour with the second common mode trap 140.

Thus, in this example an improvement by more than 30 dB can be achieved at the IF frequency.

The first and second mixers 110, 120 are operated in common mode with the LO frequency of the local oscillator.

The IF intermediate frequency forms the difference between the high frequency HF and the LO frequency of the local oscillator.

The first common mode trap 130 which is coupled to the HF connection 101 is used to reduce the effect of the common mode with the LO frequency of the local oscillator. This can be achieved whereby the first common mode trap 130 is tuned to the frequency of the local oscillator. This is advantageous because a simple and cost-effective possibility for avoiding the influence of the common mode with the frequency of the local oscillator can thus be achieved. In particular, this can be achieved by means of a cost-effective and simple configuration of the common mode trap, namely by a combination of coils and capacitors. Furthermore, the HF receive signal is not influenced by the common mode trap if the common mode trap is sufficiently well tuned.

The second common mode trap 140 is tuned with the IF intermediate frequency; the desired differential component of the second differential signal with the IF intermediate frequency is not negatively influenced hereby since the common mode trap only suppresses the common mode component.

Thus, a cost-effective and energy-saving configuration of the wireless receiver with a mixer can be achieved.

The invention claimed is:

1. A mobile wireless receiver comprising:

an HF input, an intermediate frequency output, a first and second mixer, which are each operated in common mode with a frequency of a local oscillator, a first balun circuit, which is coupled to the HF input and a second balun circuit, which is coupled to the intermediate-frequency output, a first common mode trap, which is coupled to the first balun circuit and the first and second mixer and a second common mode trap, which is coupled to the second balun circuit and the first and second mixer, wherein, the first and second common mode trap each comprise a Y circuit with two coils and a capacitor or a Y circuit with two capacitors and a coil, wherein one end of the Y circuit is connected to a pole of a differential signal and the other end of the Y circuit is coupled to earth.

2. A mobile wireless receiver according to claim 1, wherein, the first common mode trap is tuned to the frequency of the local oscillator and the second common mode trap is tuned to the intermediate frequency of the signal at the intermediate-frequency output.

\* \* \* \* \*